March 8, 1966 L. S. HOODWIN 3,239,373

PRINTED CIRCUIT PROCESS

Filed April 24, 1962

INVENTOR.
LOUIS S. HOODWIN
BY Carl Livingston
ATTORNEY.

3,239,373
PRINTED CIRCUIT PROCESS

Louis S. Hoodwin, Rte. 1, Sawyer, Mich.
Filed Apr. 24, 1962, Ser. No. 189,889
9 Claims. (Cl. 117—212)

This invention pertains to printed circuit techniques and provides a simplified and economical process for forming electro-conductive circuit connections and certain types of circuit component by methods involving a few simple operations and requiring no special skills and generally less equipment than commonly necessary in the usual photo-resist etching and like processes, the new method being adaptable to the manufacture of printed circuit boards, modules, and certain types of capacitive, inductive, and resistive device, as well as to the completion of circuit connections between components already mounted on panels, or between terminals existing on potted and like instrumentalities.

The disclosed process makes use of a chemical-deposit type of metallizing which precipitates a conductive film on a desired surface as the result of confluence or commingling of reagent solutions at the situs of deposit in accordance with principles understood in the art, an important feature of novelty characterizing the new process being the use of readily miscible solvents or liquid carriers for the reagent materials, and the use of a masking overlay which is strongly repellent to such solvents or carriers to such an extent that it inhibits the release or deposit of the metal on any surface masked by the repellent coating precisely up to the margins thereof, so that the metallic deposit is characterized by a very sharp line of demarcation.

More detailed aspects of the process and its advantages and capabilities are described hereinafter in view of the annexed drawing, in which.

Figures 1, 2, 3, 4, 5:
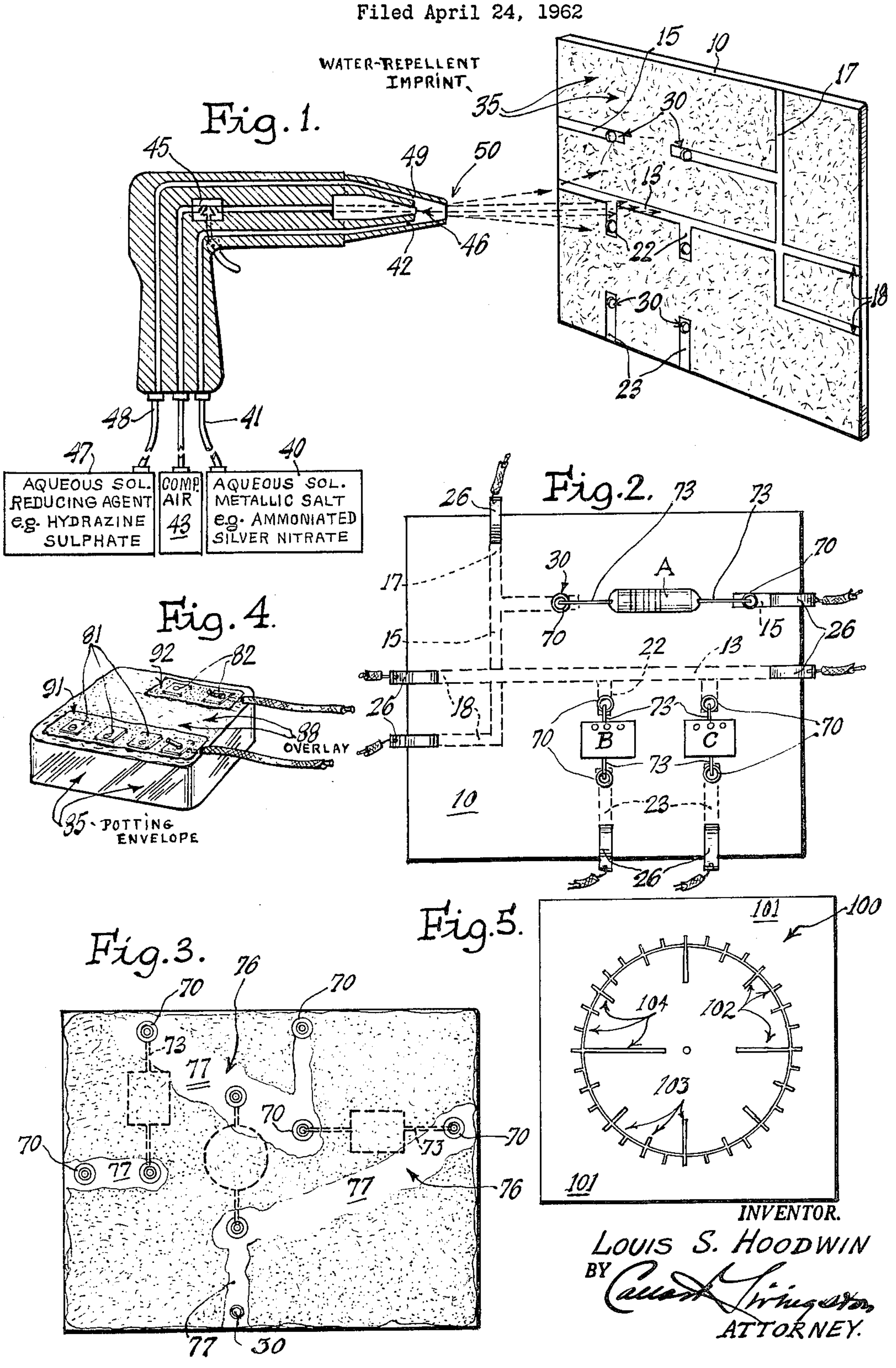
FIG. 1 is a schematic diagram of one method of applying the metallizing solutions to a printed-circuit panel shown in perspective.
FIG. 2 is a plan view of a completed circuit panel.
FIG. 3 is a plan view of another circuit panel illustrative of a modification in the masking operation.
FIG. 4 is a perspective view of a circuit component of the potted type illustrating an interconnection of terminals which can be effected by the process.
FIG. 5 is a plan view of a special circuit component illustrative of the application of the process to the manufacture of a close-tolerance electrical device.

In accordance with the present method, the object to be metallized, for instance a circuit panel 10, such as depicted in FIG. 1, will first be provided with an outline of the desired circuit configurations, for example the several conductive paths 13, 15, 17, 18, 22, 23, intended for interconnection of circuit components A, B, and C mounted, or to be mounted on the panel in the manner shown in FIG. 2.

For production purposes, such a configuration may be an imprint transferred from a master pattern in the form of an ordinary printing plate or lithographic plate, or a stencil, silk screen or the like, employed in a suitable press using a hydrophobic ink or grease of proper consistency according to the type of master used, such that the areas intended to be non-conductive will be coated with the ink or grease in the manner indicated by the stippled areas 35 in FIG. 1, leaving the panel areas corresponding to the aforesaid conductive paths exposed for contact by the metallizing fluid. If desired, the water-repellent coating may also be applied manually by use of a brush, as will more particularly appear in view of FIG. 3.

The imprinted or coated panel is then set up on edge at a suitable draining angle before the nozzle 50 of a spraying device which may take the form of a mixing gun having hose connections with the metallizing liquids and a source of compressed air effective, on release, to propel the liquids into confluence as they reach the panel. The metal will be deposited at once in a thin and substantially uniform film having margins following the outline of the masking overlay very sharply.

Because of its good conductivity and ready precipitating action, silver is a satisfactory and, in most cases, the preferred metal for use in this process, the same being derived from a suitable compound soluble or miscible with the liquid intended for use with the particular repellent agent employed in the coating. A good aqueous working solution can be made by dispersing silver nitrate in the desired concentration in water to which is added an alkaline precipitating agent sufficient in quantity to precipitate and redissolve the silver, ammonium hydroxide being suitable for this purpose. The working solution for the reducing or precipitating reagent is preferably a 20 to 50 percent solution of hydrazine sulphate in water.

However, metals other than silver may be deposited by this method by substituting an appropriate water-soluble salt thereof in the metallic working solution, and a correspondingly appropriate precipitating or reducing agent in the companion solution. For example, copper sulphate may be substituted in the aqueous metal-carrying solution and hydrazine hydroxide may be used in the reagent solution to lay down a conductive film of copper.

The respective working solutions are fed from supply containers 40, 47 via corresponding flexible hose connections 41, 48 to the nozzle orifices 42, 49, contiguous to the air jet orifice 46 in the mixing gun, compressed air from source 43 being controllably released by a trigger-valve means 45 to create a low-pressure jet zone at the other two orifices which aspirates the metallizing liquids and propels the same in approximately equal amounts into confluence before impinging upon the surface of panel 10, the redissolved silver being finally precipitated or liberated by the reducing agent in the second solution and depositing out as a film on the ink-free areas, as set forth.

In the case of imprints made with lithographic inks containing fast driers, the spraying should be done while the ink remains sufficiently wet to fully utilize the excellent water-repellent function of such inks in sharply delineation a clean outline of the desired conductive pattern, this being especially important in fabricating capacitors, inductances, and devices such as the capacitive pick-up wheel shown in FIG. 5.

The initial conductive deposit produced by these methods is in the nature of a thin frangible film for which it may be desirable in some cases to provide a scratch-resistant overlay of any of the numerous resin coatings employed for such purposes and applied by spraying or dipping treatments in accordance with practices understood in the art.

Both the current-carrying capacity and the physical strength of the conductive pattern may be increased by electrolytically depositing thereon a heavier overlay of copper throughout the pattern or in localized zones such, for example, as the terminal areas where clip-on connectors 26 or the like (FIG. 2) may be repeatedly applied; and the abrasion resistance may also be increased by application of conductive paints, solder dipping, sputtering, and like known expedients.

The process, as described in view of FIGS. 1 and 2, may be applied to circuit boards on which components have been previously mounted as distinguished from rudimentary wiring or conductive board layouts upon which the components are later to be installed; and this mode of the process is therefore capable of achieving in a single operation a simultaneous laying down of conductive paths and circuitry, and the interconnections therewith of the various component terminals and any necessary working or external-connection terminals.

A further example of the flexibility of the disclosed process is illustrated in FIG. 3 wherein metallic board terminals of any flush type, such as eyelets or rivets 70, are set appropriately in holes 30 located in the circuit lanes to be metallized, the component leads 73 being soldered directly to such rivets or eyelets on the top side of the panel, following which the circuit pattern may then be outlined manually on the obverse side by application of the water-repellent grease or ink using an applicator such as a swab or brush if volume production is not involved; or, for production purposes the water-repellent coating may be laid down by a stencilling operation or imprinting block, whereupon the conductive film 76 will be sprayed-on to establish the necessary interconnections 77 between the eyelet terminals 70, the optional scratch-proof coating operation completing the treatment, as previously described.

The method is not restricted to use with rigid or perfectly flat panels, but is readily applicable to many irregular surface configurations such as those encountered in connection with potted and encapsulated devices similar to that depicted in FIG. 4, which may be a complex internally wired module having a plurality of external terminal tabs 81 in one group, and other terminals 82 in another group. Such a potted device will usually be already provided with a skin or envelope 85 of any of a number of well-known moisture-proof protective coating and sealing materials.

The terminals of such a device can be interconnected as desired by the present process by first cleansing them of any potting material, grease, etc., and pressing the terminal tab close down upon the surrounding surface, and thereafter outlining thereon the desired circuit paths by brushed or swabbed application of lithographic ink or water-repellent grease in the manner explained in view of FIG. 3.

For example, if it is assumed that one terminal group 81 comprises four terminals requiring connection together and another group 82 comprises two terminals likewise to be interconnected in common, the two groups need only to be separated by an application 88 of the water-repellent substance which will not only separate one group from the other but will extend into any other areas, especially on the adjoining parts of the top and sides of the device, from which it is desired to exclude the metal deposits 91, 92 which will be sprayed on in the manner described in view of FIGS. 1 or 3, whereby to provide the desired interconnections for each group.

Following any of the foregoing metallizing operations, the sprayed units may be immersed in a suitable solvent or degreasing bath which will remove the ink or grease overlay, the process then being basically complete, the attachment of external wiring leads, if any, or the application of scratch-resistant or like protective coatings, being regarded as supplemental operations.

An important advantage of the process arises from use of a drying type of water-resistant overlay or ink which eliminates necessity for removal because it may simply be allowed to dry and remain permanently on the board.

In this respect the described process is superior to the photo-resist etching methods because the latter require removal of the masking overlay to expose the conductive areas remaining after the etching process is completed. This is also true of most abrasion processes. And in general it may be said that most prior methods which employ any kind of a stencil or mask remove the same before the apparatus is considered completed.

The disclosed method is not limited to layout or component interconnection circuitry, but may be utilized to form a variety of electro-conductive devices including the usual capacitance and inductance delineations commonly made by prior photo-mechanical and like metallizing processes, and the process is additionally useful in making critical specialty items such as capacitative "pick-up wheels" 100 used in tone generating apparatus and which embody highly critical dimensional configurations 102, 103, 104 of the type depicted in FIG. 5, and necessitating the holding of very close tolerances and standards of sharpness. Highly accurate wheels of this type can be produced economically in quantity by imprinting the configuration from a master offset plate which will deposit lithographic ink in the arcuate and radial configuration shown upon a substantially rigid sheet 101 of vinyl plastic, to be thereafter subjected to the same metallizing operation heretofore described whereby the entire sheet, except for the inked radial and arcuate outline delineations 102, 104, etc. will be covered with a conductive film of silver, the purpose and mode of operation of the specific configurations involved in such wheels being of significance here particularly in respect to the fact that the pattern must be reproduced with utmost accuracy and uniformity, with clean, sharp margins and within tolerances of plus or minus 5 percent in order that the generators may uniformly produce the requisite tone frequencies.

Essentially, the process involves the use of metal in a liquid phase which is exposed to the reducing and precipitating action of reagents likewise in liquid phase in a reaction which goes forward substantially at the moment the deposit is to be effected on the desired surface, the metallizing liquid being capable in some measure of wetting the depository surface and being prevented from effecting any deposit on the areas protected by the masking coat by reason of the non-wettable character or very high surface tension of the latter, and accordingly it is contemplated that the purposes of the process will be achieved by substitution of any metallizing solution in combination with any deposit-inhibiting agent functioning in accordance with these principles where the solvent or vehicle of the metallizing reagents is not strictly aqueous or water soluble but is nevertheless sufficiently repulsed by the coating to prevent wetting sufficient to permit the depositing action to take place on the coating material itself.

If desired, a single metallizing solution may be employed in place of multiple solutions directed into confluence immediately during approach to the target or on striking the same, in which case a single orifice spray or any other applicator may be employed with a solution of silver nitrate with sufficient ammonium or sodium hydroxide to precipitate the silver in the form of the hydroxide with sufficient excess to redissolve the silver. To this solution there will then be added, at the time the metallizing is to be done, a reducing reagent, for example dextrose or cane sugar dissolved in water to which is added sufficient nitric acid to invert the sugar to dextrose, or formaldehyde, or Rochelle salts, etc. For production purposes the multiple-solution method has the advantage that the solutions are good over a much longer period than the single solution types which must be used promptly on addition of the reducing agent to the solution containing the redissolved silver.

The aforesaid printed circuit and component interconnecting methods can be applied to both sides of a panel member, and the process importantly provides for selectively effecting cross-connections from one side of a double-faced panel to the other by reason of the fact that if no water-repellent paste or grease is permitted in any through-hole, such as the eyelet holes 30, the deposit of metal resulting from the spray treatment will lay substantial conductive deposits around the margins of such holes in conductive continuity with the metal films on the respective sides of the panel to effect good cross-connection. Conversely, cross-connection may be prevented where desired by appropriate deposits of the water-repellent material in the holes.

For production purposes involving flat panels or surfaces easily imprinted, the preferred masking material can be lithographic ink because it is commercially available for fast or slow drying operations, and also has the special advantage of being available in any color to identify different runs, circuit specifications, etc.

However, it is understood that the expression "ink" is intended to include any masking material suitable for analogous application by imprinting, brushing, spraying, screening, daubing, etc. for which purposes the masking material may have a consistency suited to the method of application required, ranging from that of a paste or grease for daubing or brushing, to that of a liquid such as a paint, varnish, or ink for screening or brushing or imprinting or offsetting, the essential qualification being that the material, whatever its consistency, shall be as highly water-repellent as possible, at least for an interval following its application, and if desired also of a drying character where the masking overlay is permitted to remain permanently or required to be permanent for identification purposes.

Greases and the like for daubing and direct manual application will usually be removed by solvents because they are not feasibly dryable since they will not have the uniform, thin filmlike character of the more fluid and liquid materials which may contain known drying oils of the oxidizable type such as linseed oil, and known oxidizers for accelerating the action.

In general, no appreciable drying will be desirable within about one-half hour in order to allow sufficient routine handling time between the imprinting and metallizing operations to take full advantage of the excellent water-repelling capabilities of a lithographic ink.

I claim:

1. A process for the fabrication of printed circuits which comprises the steps of outlining on a water wettable surface of a base member a desired pattern to be metallized by applying thereon a deposit of a highly water-repellent overlay coating in a manner outlining said pattern and shielding areas not to be metallized with said water-repellent coating; and subjecting said surface of said base member to a spray treatment comprising two confluently directed streams of aqueous solutions one of which contains a salt of the metal to be deposited, and the other of which contains a precipitating agent reactive with the salt upon confluent intermingling of the solutions on said treated surface to cause the metal to be liberated and deposited as a film on any areas which are free of said water-repellent coating substance, said solutions and resultant depositing of metal therefrom being effectively repelled from areas covered by said substance so that no metal is deposited on said coating.

2. A method for producing module assemblies of the printed circuit type which comprises mounting circuit components on an insulating plate having a surface wettable by water with conductive terminals secured close against said surface of said plate and exposing outwardly facing conductive portions thereof in a plane closely contiguous to said surface, and thereafter conductively interconnecting said exposed terminal portions in a desired circuit pattern by depositing upon said base surface a highly water-repellent ink of the lithographic type in areas bordering the desired conductive paths of said pattern, said paths including desired ones of said exposed terminal portions, and thereafter effecting deposit of a film of conductive metal upon said paths and exposed terminal portions by intermingling in admixture thereupon reactive water-carried metallizing solutions one of which is principally an ammoniated solution of silver nitrate, and another of which is principally a water solution of hydrazine sulphate mutually effective in admixture upon the areas of water-wettable surface as aforesaid which are free of said deposit, to cause release of the silver metal and precipitation thereof as a conductive film only upon the uninked areas defining said paths and upon said exposed terminal portions included therein.

3. A printed circuit process comprising the preparation of a printing plate delineating in outline form upon a water-wettable surface thereof a desired conductive circuit pattern, making an impression from said plate in a highly water-repellent ink upon a water wettable surface on a non-conductive base in a manner to define said pattern by uninked circuit areas and to outline said pattern by inked areas bordering said circuit areas, and spraying said base including particularly the uninked areas thereof with confluent water solutions one of which contains a substantial amount of silver nitrate dissolved in ammonium hydroxide, and another of which contains a reprecipitating reagent in the form of hydrazine sulphate adapted upon combination with said first solution to precipitate silver upon the circuit areas not covered by said ink, and thereafter removing said ink.

4. A process for electrically connecting terminals exposed on the surface of an insulating envelope, which can be wetted by water, by means of conductive paths formed by deposited metallic films engaging said terminals, said process comprising intermingling at least on said paths and terminals, mutually reactive and miscible metallizing solutions in all of which the solvent is predominantly water, and one of which contains a conductive metal precipitatable therefrom, and another of which contains a reducing agent effective to cause liberation of said metal as a film as a result of comingling of said solutions substantially at a time when the same are brought into contact with said surface, and preventing the deposit of said metal on desired portions of said surface by covering said portions with a coating which is stongly repellent of water.

5. A printed circuit process which comprises the steps of applying to water wettable surface portions on a base member a circuit-defining coating of strongly water-repellent substance in a manner to leave uncoated desired areas of said surface portions which are to be made conductive, and applying to said surface portions and areas indiscriminately metallizing agents carried in solution with water as the predominant solvent, said metallizing agents being active in contact with said uncoated areas to deposit thereon a film of conductive metal and being actively repulsed from said water repellent coating and thereby prevented from laying down any metal deposit thereon whereby the coating need not be removed after the metallizing action is completed.

6. The process of effecting conductive deposits on a non-conductive surface which is not substantially repellent of water, which process comprises the steps of applying to portions of said surface a highly water-repellent lithographic ink in a manner to cover areas not to be rendered conductive and to leave exposed other areas intended to be conductive, and directing onto said surface generally a metal and a precipitating reagent both in aqueous liquid phase and reactive to cause substantially immediate deposition of said metal on those areas from which aqueous liquid is not repelled by the lithographic ink.

7. The method of making printed circuit and like devices which comprises the use of a metallizing means including conductor metal and reagent means in water solution and reactive when comingled in solution to cause deposit of the metal as a film on a surface wettable by the solution; and delineating on the surface of a body wettable by said solution a desired circuit pattern by means of a high surface-tension masking substance which repels water and is not wettable by said solution, said substance being applied in a manner to cover said areas not intended to be conductive and to leave exposed areas of said body which are wettable by the solution as aforesaid whereby to lay down a conductive metallic film in said last-mentioned areas not masked by said substance.

8. A method according to claim 7 further characterized in that said non-wettable masking substance is initially in a viscous state on application to the body and contains a drying agent effective to render the repellent substance substantially dry after a predetermined time longer than necessary for said conductor metal to deposit out following contact with said exposed areas.

9. An electro-conductive device including an insulating panel having a water-wettable surface provided with a desired circuit configuration thereon comprising desired conductive zones delineated in outline by a coating on said surface of a highly water-repellent material in the nature of a lithographic ink containing oil, grease, or like substance, in substantial quantity to repel water, together with a drying agent, and a chemically-deposited conductive film adhering to the wettable surface portions exposed by said coating on said panel in said outline zones and comprising a metal of the type capable of forming water-soluble and water-miscible salts reactable with water-soluble and water-miscible reagents for reducing the salts and precipitating said metal into contact adherence with said portions of the panel exposed in said zones.

References Cited by the Examiner

UNITED STATES PATENTS

| | | | |
|---|---|---|---|
| 2,000,310 | 5/1935 | White et al. | 117—35 |
| 2,139,640 | 12/1938 | Mall et al. | 117—212 |
| 2,214,476 | 9/1940 | Peacock | 117—105.5 |
| 2,919,366 | 12/1959 | Mash | 117—212 |
| 2,924,535 | 2/1960 | Schaeffer | 117—212 |
| 2,981,611 | 4/1961 | Ashworth | 117—212 |
| 3,032,443 | 5/1962 | Short | 117—212 |
| 3,090,706 | 5/1963 | Cado | 117—212 |
| 3,098,756 | 7/1963 | Haracz | 117—105.5 |
| 3,115,423 | 12/1963 | Ashworth | 117—212 |

JOSEPH B. SPENCER, *Primary Examiner.*

JOSEPH REBOLD, RICHARD D. NEVIUS, *Examiners.*